(12) United States Patent
Zhu et al.

(10) Patent No.: US 9,147,665 B2
(45) Date of Patent: Sep. 29, 2015

(54) HIGH BOND LINE THICKNESS FOR SEMICONDUCTOR DEVICES

(75) Inventors: Zhengyu Zhu, Suzhou (CN); Yi Li, Suzhou (CN); FangFang Yang, Suzhou (CN)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/887,821

(22) Filed: Sep. 22, 2010

(65) Prior Publication Data

US 2011/0037153 A1 Feb. 17, 2011

Related U.S. Application Data

(63) Continuation-in-part of application No. 11/935,915, filed on Nov. 6, 2007, now Pat. No. 7,825,501.

(51) Int. Cl.
*H01L 23/495* (2006.01)
*H01L 23/00* (2006.01)
*B81B 7/00* (2006.01)

(52) U.S. Cl.
CPC .............. *H01L 24/32* (2013.01); *B81B 7/0048* (2013.01); *H01L 23/49513* (2013.01); *H01L 24/83* (2013.01); *H01L 24/97* (2013.01); *H01L 24/29* (2013.01); *H01L 24/48* (2013.01); *H01L 2224/26175* (2013.01); *H01L 2224/27013* (2013.01); *H01L 2224/291* (2013.01); *H01L 2224/2919* (2013.01); *H01L 2224/29111* (2013.01); *H01L 2224/29116* (2013.01); *H01L 2224/29139* (2013.01); *H01L 2224/29144* (2013.01); *H01L 2224/29339* (2013.01); *H01L 2224/32225* (2013.01); *H01L 2224/48247* (2013.01); *H01L 2224/83051* (2013.01); *H01L 2224/8385* (2013.01); *H01L 2224/92* (2013.01); *H01L 2224/92247* (2013.01); *H01L 2224/97* (2013.01); *H01L 2924/014* (2013.01); *H01L 2924/01005* (2013.01); *H01L 2924/0105* (2013.01); *H01L 2924/01006* (2013.01); *H01L 2924/01013* (2013.01); *H01L 2924/01029* (2013.01); *H01L 2924/0132* (2013.01); *H01L 2924/0133* (2013.01);

(Continued)

(58) Field of Classification Search
USPC ........................................................ 257/676
See application file for complete search history.

(56) References Cited

U.S. PATENT DOCUMENTS 4,218,701 A * 8/1980 Shirasaki ...................... 257/778
5,737,191 A * 4/1998 Horiuchi et al. .............. 361/764

(Continued)

FOREIGN PATENT DOCUMENTS

EP 0729652 B1 10/2002

*Primary Examiner* — Earl Taylor
(74) *Attorney, Agent, or Firm* — Kenneth E. Horton; Kirton McConkie

(57) ABSTRACT

Die attach methods used in making semiconductor devices and the semiconductor devices resulting from those methods are described. The methods include providing a leadframe with a die attach pad, using a boundary feature(s) containing a bond wire to define a perimeter on the die attach pad, depositing a conductive material (such as solder) within the perimeter, and then attaching a die containing an integrated circuit device to the die attach pad by using the conductive material. The boundary feature(s) allow an increased thickness of conductive material to be used, resulting in increased bond line thickness and increasing the durability and performance of the resulting semiconductor package. Other embodiments are described.

8 Claims, 5 Drawing Sheets

(52) U.S. Cl.
CPC .............. *H01L 2924/01033* (2013.01); *H01L 2924/01047* (2013.01); *H01L 2924/01068* (2013.01); *H01L 2924/01075* (2013.01); *H01L 2924/01078* (2013.01); *H01L 2924/01079* (2013.01); *H01L 2924/01082* (2013.01); *H01L 2924/0665* (2013.01); *H01L 2924/078* (2013.01); *H01L 2924/0781* (2013.01); *H01L 2924/07802* (2013.01); *H01L 2924/10329* (2013.01); *H01L 2924/14* (2013.01); *H01L 2924/1461* (2013.01); *H01L 2924/15747* (2013.01); *H01L 2924/19107* (2013.01)

(56) References Cited

U.S. PATENT DOCUMENTS

| | | | | |
|---|---|---|---|---|
| 5,942,798 | A * | 8/1999 | Chiu | 257/737 |
| 6,020,637 | A | 2/2000 | Karnezos | |
| 6,031,771 | A | 2/2000 | Yiu et al. | |
| 6,228,679 | B1 * | 5/2001 | Chiu | 438/108 |
| 6,391,683 | B1 * | 5/2002 | Chiu et al. | 438/108 |
| 6,459,144 | B1 * | 10/2002 | Pu et al. | 257/667 |
| 6,600,232 | B2 * | 7/2003 | Chiu et al. | 257/778 |
| 6,867,460 | B1 | 3/2005 | Anderson et al. | |
| 6,936,855 | B1 | 8/2005 | Harrah | |
| 6,939,746 | B2 * | 9/2005 | Bolken | 438/127 |
| 7,279,366 | B2 * | 10/2007 | Bolken | 438/125 |
| 7,791,205 | B2 * | 9/2010 | Bolken | 257/774 |
| 7,880,276 | B2 * | 2/2011 | Nishimura et al. | 257/667 |
| 8,143,110 | B2 * | 3/2012 | Karpur et al. | 438/127 |
| 8,541,891 | B2 * | 9/2013 | Saeki | 257/778 |
| 2002/0074627 | A1 * | 6/2002 | Combs | 257/666 |
| 2003/0168731 | A1 | 9/2003 | Matayabas, Jr. et al. | |
| 2007/0097740 | A1 | 5/2007 | Derhacobian et al. | |
| 2009/0115039 | A1 | 5/2009 | Zhu | |

* cited by examiner

HIGH BOND LINE THICKNESS FOR SEMICONDUCTOR DEVICES

CROSS-REFERENCE TO RELATED APPLICATION

This patent application is a continuation-in-part of U.S. application Ser. No. 11/935,915, filed Nov. 6, 2007, the entire disclosure of which is hereby incorporated by reference.

FIELD

This application relates generally to semiconductor devices and methods of making semiconductor devices. In particular, this application relates to die attach methods used in making semiconductor devices and the die packages and semiconductor devices resulting from those methods.

BACKGROUND

Often, during manufacture of semiconductor devices, one or more dies containing the integrated circuit may be bonded (or attached) to a die attach pad (or paddle) of a leadframe. The process of bonding the die to the leadframe is usually referred to as a die attach process. The die attach process may be accomplished using an electrically conductive material, such as an adhesive or solder, which connects the die to the leadframe, both mechanically and electrically. The thickness of this conductive material is often referred to as the bond line thickness (BLT).

In the die attach process, the conductive material must allow the bonding to occur between the die and the leadframe while minimizing the formation of voids in the bond. Also, the die attach process must also provide a consistent bond strength across the surface of the die, thereby minimizing localized stresses that may cause fracture or other failure of the semiconductor device. Any voids and inconsistent bond strength in the bond increases the stress and strain on the die, which may lead to cracks and failures in the semiconductor device. In addition, voids may result in inefficient or ineffectual electrical or heat conductivity, potentially causing failures in the semiconductor device. The conductive material, therefore, should have a viscosity sufficiently low to allow for effective bonding by avoiding both of these problems.

FIGS. 1 and 2 illustrate an exemplary die 110 that is attached to die pad 120 by conductive material 130 to form die attach package 100. As shown in FIG. 1, $t_1$ is the BLT between the die 110 and the die attach pad 120. Increasing the BLT by increasing the thickness of the conductive material 130 decreases the shear stress on the die, which makes larger thicknesses more desirable. However, the low viscosity required to assure no voids usually limits the thickness to less than 3 mils. But increasing the amounts of conductive material used during die attach in effort to increase BLT can result in flow of the conductive material to other portions of the leadframe or the die, potentially causing moisture path, short circuits and problems in wire bonding and often resulting in failure of the semiconductor device.

To avoid these problems, some die attach processes use a "spanker" to flatten the conductive material during the die attach process. However, using the spanker involves extra steps that make the device fabrication process longer, less productive, and more expensive. Additionally, if too much conductive material is used to attempt to achieve a high BLT, the conductive material may be displaced by the spanker from the die attach pad to other portions of the leadframe, potentially causing short-circuits and other problems.

SUMMARY

This application describes die attach methods used in making semiconductor devices and the die packages and the semiconductor devices resulting from those methods. The methods include providing a leadframe with a die attach pad, using a boundary feature(s) containing a bond wire to define a perimeter on the die attach pad, depositing a conductive material (such as solder) within the perimeter, and then attaching a die containing an integrated circuit device to the die attach pad by using the conductive material. The boundary feature(s) allow an increased thickness of conductive material to be used, resulting in increased bond line thickness and increasing the durability and performance of the resulting semiconductor package.

BRIEF DESCRIPTION OF THE DRAWINGS

The following description can be better understood in light of Figures, in which.

Figure 1:
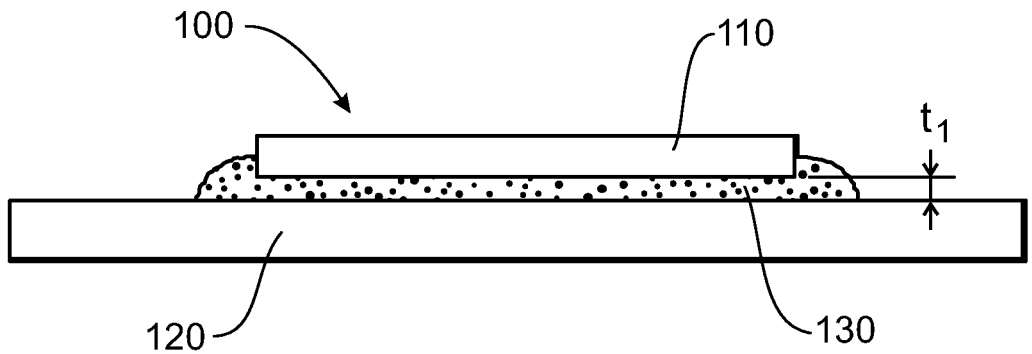
FIG. 1 illustrates a perspective view of a known die package with a die bonded to a die attach pad of a leadframe.
Figure 2:
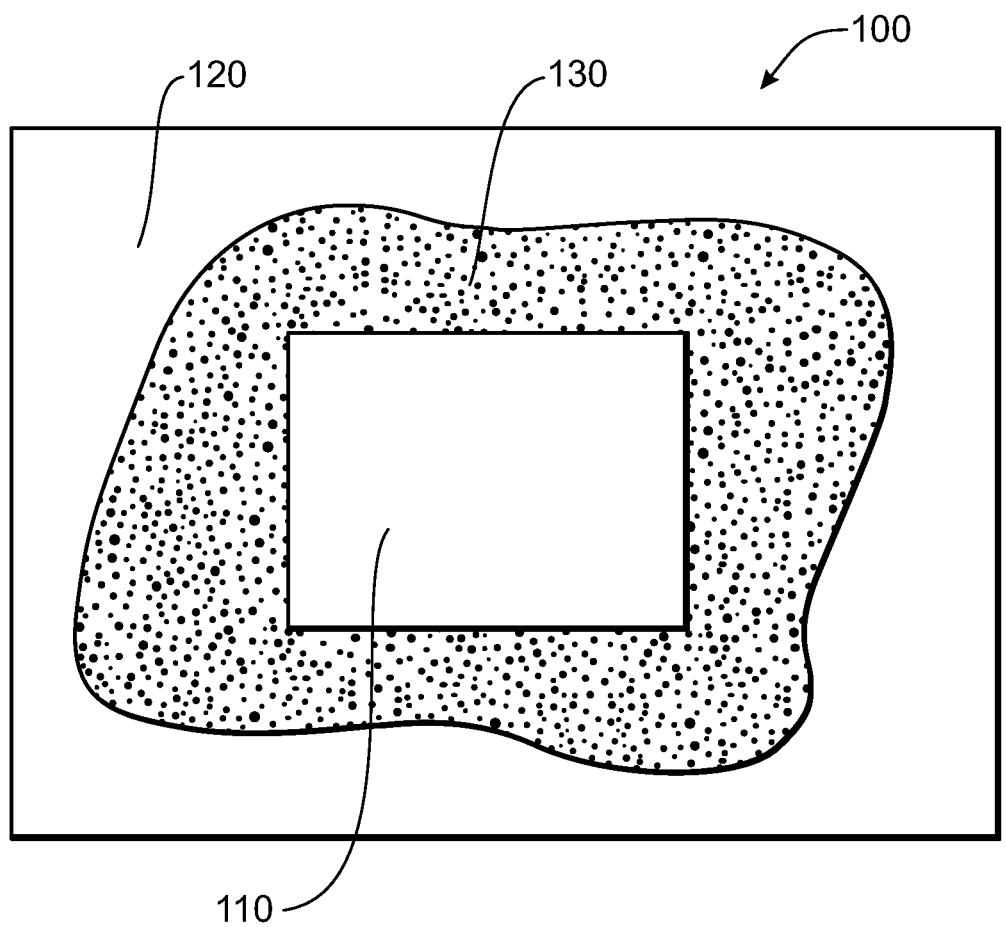
FIG. 2 illustrates another view of the die package shown in FIG. 1.

The Figures illustrate specific aspects of the semiconductor devices and associated methods of making and using such devices. Together with the following description, the Figures demonstrate and explain the principles of the semiconductor devices and associated methods. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the apparatus and associated methods of using the apparatus can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on die attach processes for semiconductor devices and packages, the devices and associated processes could be equally applied to any process or device where a die is connected to a die attach pad, such as a printed circuit board, MEMS devices, and the like.

Figure 3:
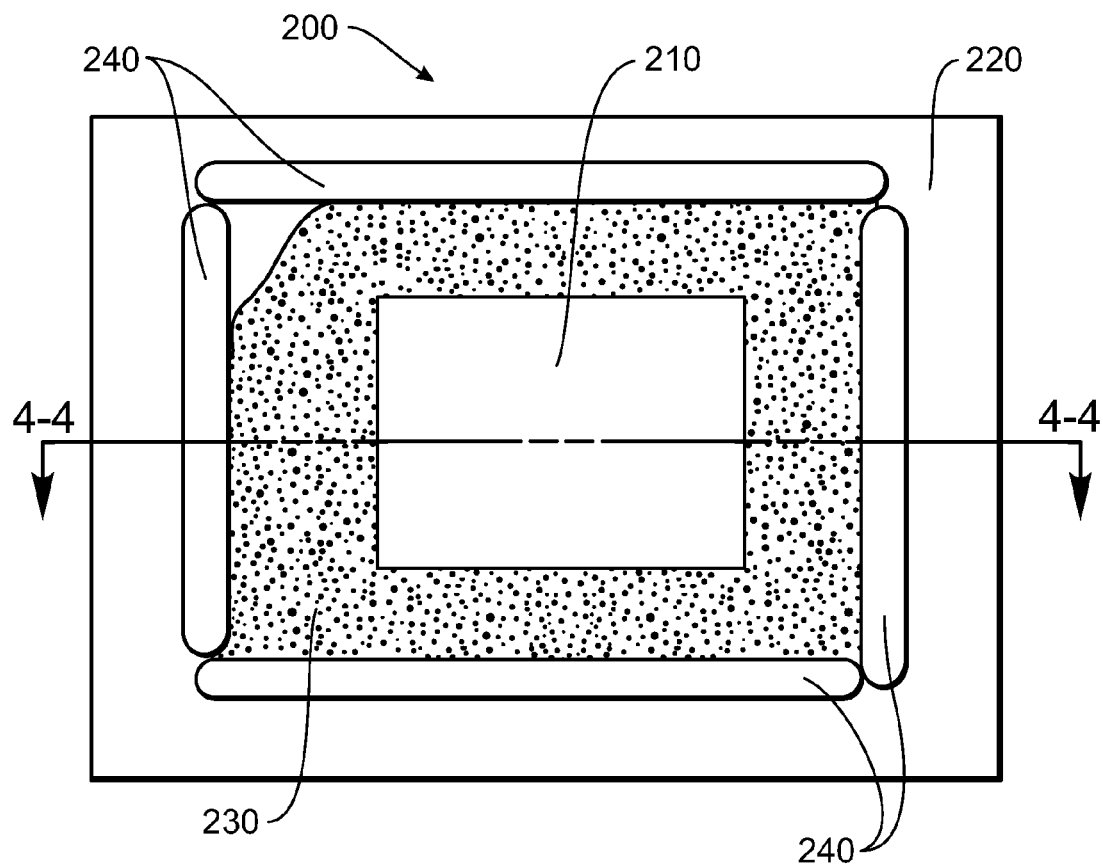
FIG. 3 illustrates a top view of an exemplary die package with boundary features containing a bond wire.
Figure 4:
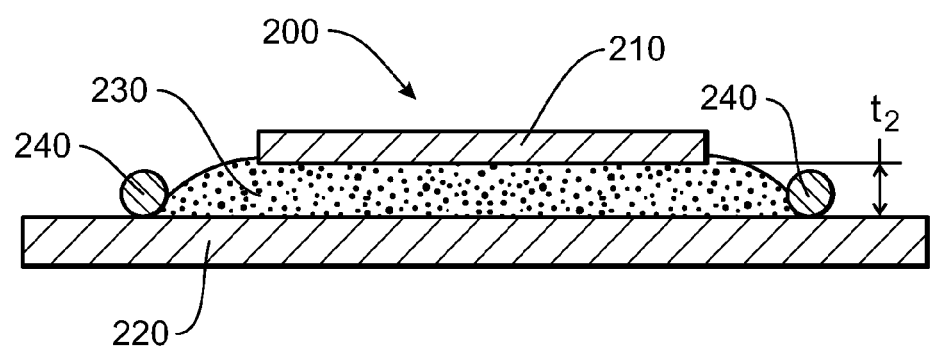
FIG. 4 illustrates a cross-sectional view of the die package shown in FIG. 3.
Figure 5:
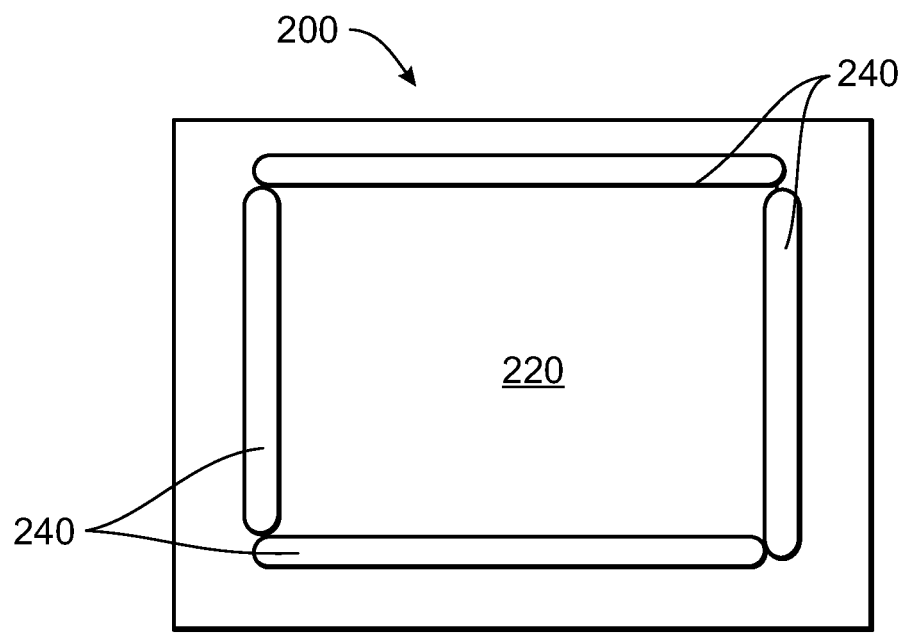
FIG. 5 shows a top view of some embodiments of a die attach pad containing boundary features formed on an upper surface thereof.

One exemplary die package formed using the methods describe herein is illustrated in FIGS. 3 and 4. In FIG. 3, the die package 200 contains a die 210 bonded to a die attach pad 220 by conductive material 230. Boundary features 240 containing a bond wire form a perimeter on die attach pad 220 around the die 210 and the conductive material 230. As shown in FIG. 4, the conductive material 230 may be located between die 210 and die attach pad 220 with a bond line thickness (BLT) represented by a thickness $t_2$.

The die 210 may comprise any type of semiconductor die known in the art. In some embodiments, the die comprises a silicon-based substrate containing any integrated circuit device known in the art. But in other embodiments, the die may also be made of GaAs, SiC, GaN, or any other suitable semiconductor material. The substrate and the integrated circuit device may have any configuration desired and needed to perform any desired function. For example, the die 210 may include one or more discrete transistors, diodes, or other known integrated circuit device. Thus, the die 210 may be designed to perform any number of functions, such as power regulation, memory, processing, or any other integrated circuit (IC) function. The die 210 may have any size needed for these functions. In some embodiments, the size of the die can range, for example, from about 100 μm by about 100 μm to about 20000 μm by about 20000 μm.

The die attach pad 220 may be a portion of any leadframe known in the art or may be a separate paddle. As well, the die attach pad 220 may be a single die attach pad of a leadframe, may be one of a plurality of die attach pads on a leadframe, or plurality of connected leadframes used in semiconductor manufacturing. When a leadframe is used, it is formed so that it is relatively planar in the area of the die attach pad 220. The leadframe serves as part of the I/O interconnection system, and also provides a thermally conductive path for dissipating the majority of the heat generated by the integrated circuit device in the die 210.

The material of the leadframe may comprise any metal, such as copper or a copper alloy. In some instances, the leadframe can contain a layer of metal plating (not shown), if desired. The layer of metal plating may comprise an adhesion sublayer, a conductive sublayer, and/or an oxidation resistant layer. For example, the leadframe may include a leadframe plating containing an adhesion sublayer and a wettable/protective sublayer.

The die 210 and the die attach pad 220 can be attached to each other by a conductive material (that forms a layer) 230. The conductive material 230 may be any conductive material that can attach these two components to each other. In some embodiments, the conductive material 230 comprises a solder that is configured to be used in a die attach process. For example, the conductive material 230 may be a Pb—Sn, Au—Sn, or other solder. Other solders that may be used as conductive material 230 may be made of Sn, Ag, and/or Pb—Sn—Ag. In some embodiments, the conductive material 230 may be an adhesive configured to be used in a die attach process. For example, an adhesive conductive material 230 may be a non-conductive or a conductive epoxy material like silver epoxy.

As shown in FIG. 4, the die package 200 contains wire-shaped boundary features 240 that form a perimeter on the die attach pad 220 around the area containing the conductive material 230. The boundary features 240 function to allow an increased amount of conductive material 230 to be used in the die bonding process, resulting in a higher BLT. In other words, the boundary features 240 comprise a raised surface of a sufficient height to make it a boundary for the conductive material 230.

FIG. 4 illustrates one example of the BLT that can be obtained and is represented by $t_2$. In some embodiments, $t_2$ may range up to 30 mils. In other embodiments, this thickness can range from about 4 to about 30 mils.

The size of the perimeter defined by boundary features 240 depends on the size of the die and, therefore, the type of semiconductor device being made. In some embodiments, the perimeter can measure from about 100 μm by about 100 μm to about 20000 μm by about 20000 μm. And while the perimeter is illustrated as being substantially rectangular in shape, the shape will also depend on the shape of the die 210 and can therefore be substantially square, circular, triangular, or polygonal.

The boundary features 240 may form a complete or partial boundary. In some embodiments, and as shown in FIGS. 3 and 4, the wire bond of the boundary features may be applied to form a complete perimeter on the die attach pad 220. In other embodiments, the boundary features 240 may be applied to form a partial perimeter, such that about 75% or even 50% or more of the perimeter is defined by the wire bond of the boundary features 240.

Figure 7A:
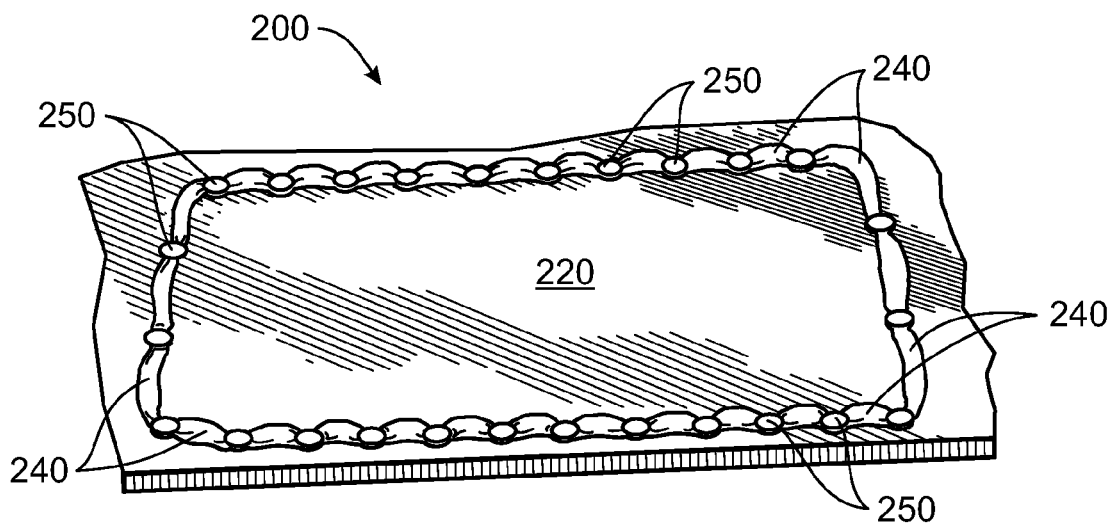
FIGS. 7a and 7b shows perspective views of some embodiments of a die attached to the die attach pad with different configurations of bond wire connection points of the boundary feature.
Figure 7B:
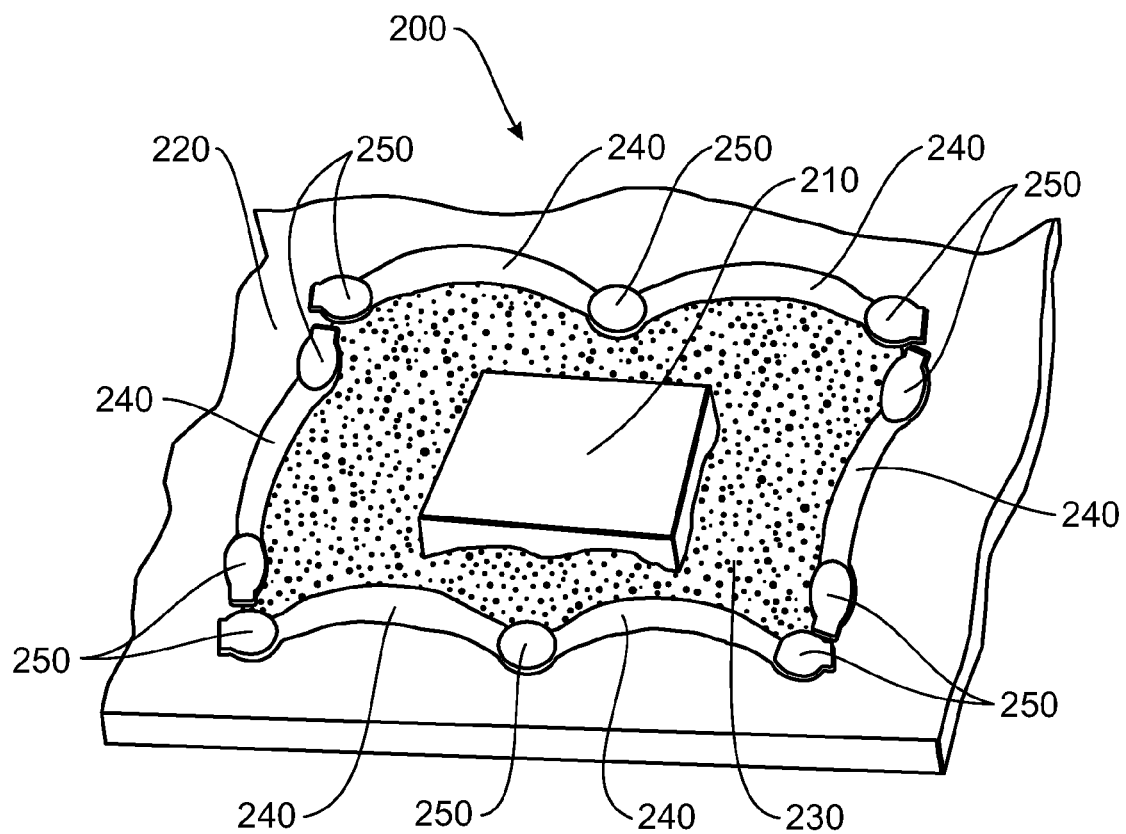

In some embodiments, the boundary features 240 may comprise 1 or more bond wires that can be bonded to the die attach pad 220. In some configurations, and as shown in FIG. 7b, 4 bond wires (such as those wires that are known to be used to attach a die to a lead finger), can be bonded to the die attach pad 220 so as to form the perimeter that will contain the conductive material 230. In other configurations as illustrated in FIG. 7a, a single segment of a bond wire can be bonded at various points of the wire to form the perimeter. Additionally, any number of segments of wire may be bonded to form the wire as is convenient or necessary to form the perimeter.

Figure 8A:
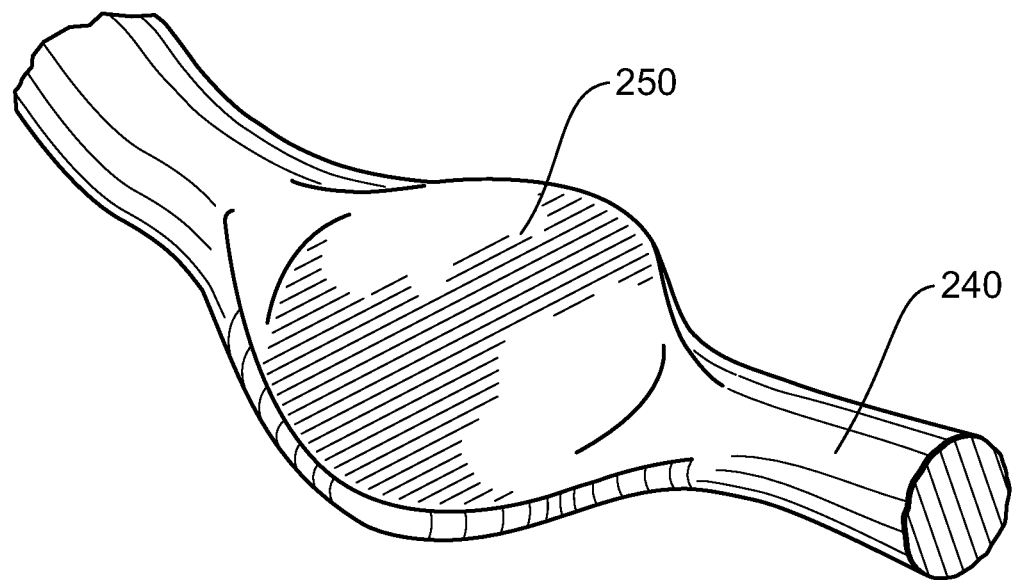
FIGS. 8a and 8b depict details of the bonds used to attach the bond wire of the boundary feature to the die attach pad.
Figure 8B:
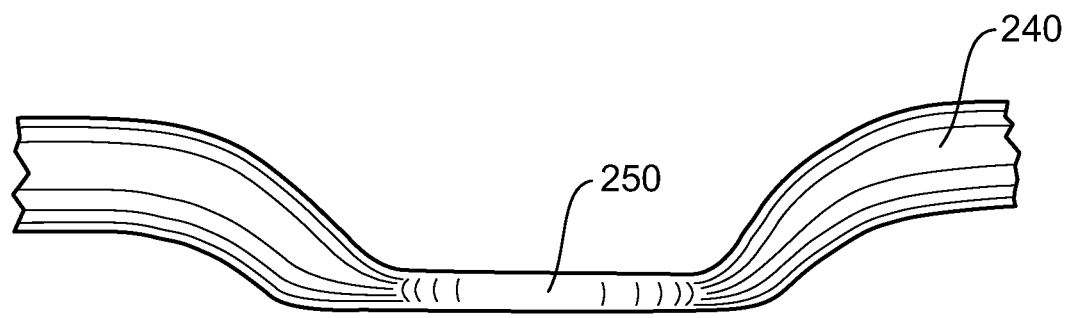

Each bond wire can be attached to the die attach pad 220 using any technique known in the art. In some embodiments, the bond wire(s) can be attached to the die attach pad 220 by using a stitch and/or wedge bond 250 at each end, as shown in FIGS. 8a and 8b. Where longer bond wires are used, one or more stitch and/or wedge bonds between the ends of the bond wires can be included as needed.

These structures described above may be formed using any known process that will form the structures illustrated above. In some embodiments, the die 210 can be manufactured by providing the various electronic components (i.e., the transistors) in a semiconductor substrate as known in the art. In other embodiments, the integrated circuits are manufactured, cut, tested, and die-bonded to a substrate as known in the art.

Next, a leadframe can be formed by any known method, for example, by any metal stamping and etching processes. If desired, a layer of metal plating may be formed on the base metal used in the leadframe by processes such as electroless plating, sputtering, or electroplating. A pre-plated leadframe can also be used instead. The leadframe is made with the die pad 220 formed as part of the leadframe.

Next, the bond wire can be attached to the die attach pad 220 using any known technique. In some embodiments, the boundary features 240 may be attached using a bond wire stitching technique known in the art. The bond wire of the boundary features 240 may be connected (i.e., by using a stitch or wedge bond 250 as illustrated in FIGS. 8a and 8b) to the die attach pad 220 using any number of connection points. In one example, and as shown in FIG. 7b, the boundary feature is connected along the perimeter using a stitch and/or wedge bond 250 having multiple attach points along the perimeter. In another example as shown in FIG. 7a, any side of the perimeter may have as many connection points as needed, including from 4 to 40 stitch and/or wedge bonds.

FIGS. 8a and 8b show a detailed view of a bond wire stitch that can be used to connect the bond wire of the boundary feature to the die attach pad. As known in the art of wedge/stitch wire bonding, the wire becomes deformed at the point of attachment to the die attach pad, as illustrated in FIG. 8a. FIG. 8b shows a cross sectional view of the bond wire and its stitch bond attachment. The wedge/stitch bond used with the boundary features 240 may be used at any point(s) along the perimeter to provide the needed connection for the bond wire.

Figure 6:
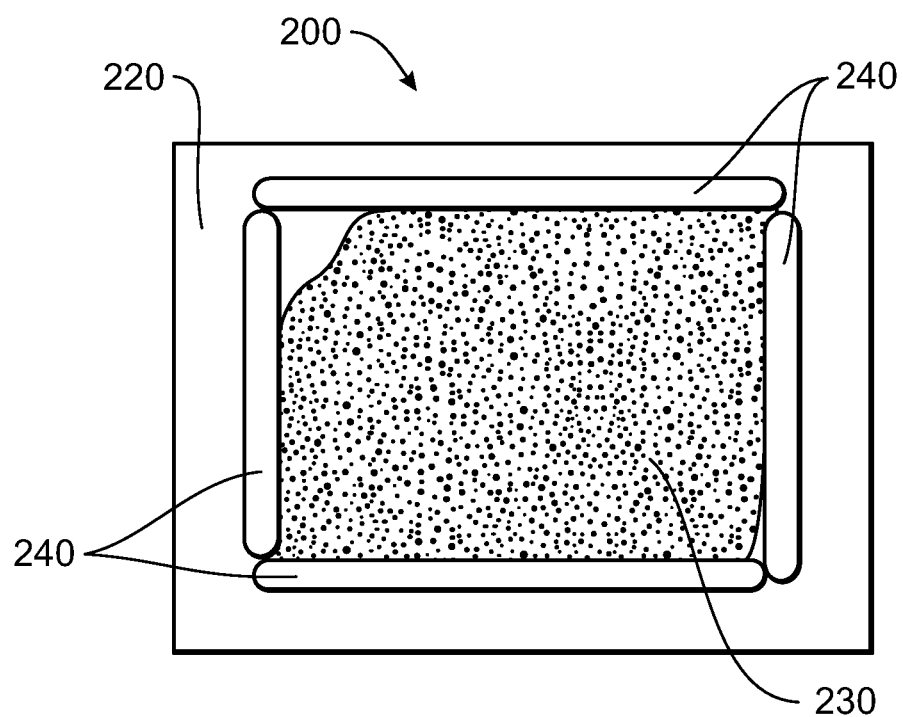
FIG. 6 illustrates a top view of some embodiments of a die attach pad with a conductive material formed between the boundary features.

Next in the manufacturing process, as shown in FIG. 6, the conductive material 230 can be deposited onto the die attach pad 220 within the perimeter defined by the boundary features 240. The conductive material can be deposited using any known process until the desired height is reached that will provide the desired BLT. In some embodiments, a spanker may be used to flatten the conductive material 230. In other embodiments, though, no spanker is used due to the possibility of conductive material 230 being displaced or splashed out of the perimeter defined by the boundary features 240.

Then, the die 210 is then placed onto the conductive material 230 using any known process in the art. The resulting structure can then be heated at a sufficient time and temperature that will re-flow the conductive material 230 without changing the shape of the bond wire used in the boundary feature(s) 240. During the re-flow process, the conductive material 230 is forced to stay with the perimeter established by the boundary feature 240. After the reflow process is complete, the die 210 is attached to the die attach pad 220 by the reflowed conductive material 230 that has the desired height, yet has substantially no voids.

Once the die package has been formed in this manner, further processing can be performed to make a semiconductor device. For example, electrical connections may be established between portions of integrated circuit device on the die and portions of the lead fingers using wires, usually with a wire bonding process. After the wire bonding process, a resin body can be formed to encapsulate the die and the wirebonds. The resulting structure may then be singulated (and optionally tested) to create a semiconductor package with leads. The package leads can then be connected to another electrical device, such as a printed circuit board (or PCB) so that it is connected electrically to the integrated circuit of the die.

The die packages described above have several advantages. First, a higher BLT allows for more robust die packages, limiting the mechanical failure of die 210 due to cracking and due to voids in conductive material 230. The higher BLT also can result in increased thermal performance, limiting the failure rate of die 210.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor device, the comprising:
   a leadframe containing a die attach pad;
   a conductive layer on a portion of the die attach pad, wherein the conductive layer has a thickness ranging up to about 30 mil;
   a boundary feature comprising a bond wire partially surrounding and contacting the conductive layer, wherein both ends of the bond wires are attached to the die attach pad; and
   a die on the conductive layer.

2. The device of claim 1, wherein the boundary feature completely surrounds the conductive layer.

3. The device of claim 1, wherein the boundary feature surrounds at least half of the conductive layer.

4. The device of claim 1, wherein the conductive layer has a thickness ranging from about 4 mil to about 30 mil.

5. The device of claim 1, wherein the conductive layer is substantially free of voids between the die and the die attach pad.

6. The device of claim 1, wherein both ends of the bond wire have been attached to the die attach pad using a wedge or stitch bond.

7. The device of claim 6, wherein the bond wire has been attached to the die attach pad at more than two locations.

8. The device of claim 1, wherein four bond wires are used to make the boundary feature and both ends of each bond wire are attached to the die attach pad.

* * * * *